United States Patent [19]

Oram et al.

[11] Patent Number: 5,061,898
[45] Date of Patent: Oct. 29, 1991

[54] BATTERY EVALUATION TEST SYSTEM

[76] Inventors: James W. Oram, 18 W. Crystal, Lombard, Ill. 60148; Alan Schulman, 2705 Greenwood, Highland Park, Ill. 60035

[21] Appl. No.: 566,664

[22] Filed: Aug. 13, 1990

[51] Int. Cl.$^5$ ............ G01N 27/46; H01M 10/48
[52] U.S. Cl. ................................. 324/427; 320/13; 320/48; 324/428
[58] Field of Search .............. 324/427, 428; 320/13, 320/48

[56] References Cited

U.S. PATENT DOCUMENTS

| | | | |
|---|---|---|---|
| 4,549,127 | 10/1985 | Taylor | 320/21 |
| 4,583,034 | 4/1986 | Martin | 320/21 |
| 4,595,880 | 6/1986 | Patil | 324/427 |
| 4,629,965 | 12/1986 | Fallon | 320/39 |
| 4,678,998 | 7/1987 | Muramatsu | 324/427 |
| 4,849,700 | 7/1989 | Morioka | 324/427 |
| 4,952,862 | 8/1990 | Biagetti | 324/427 |
| 4,958,127 | 8/1990 | Williams | 324/427 |

FOREIGN PATENT DOCUMENTS

| | | | |
|---|---|---|---|
| 0359237 | 3/1990 | European Pat. Off. | 324/427 |
| 0482840 | 10/1972 | U.S.S.R. | 324/427 |
| 2185326 | 7/1987 | United Kingdom | 324/427 |

OTHER PUBLICATIONS

Ganssle, J., "Marine Electrical Systems", Ocean Navigator, No. 32, May 1990, pp. 40, 44–48.

Primary Examiner—Kenneth A. Wieder
Assistant Examiner—Jose M. Solis
Attorney, Agent, or Firm—Arnold, White & Durkee

[57] ABSTRACT

A method of evaluating the present capacity of a rechargeable battery by connecting a known test load to the battery so that the battery supplies the test load with electrical current; monitoring the battery voltage while the battery is connected to the test load; monitoring the current supplied to the test load by the battery, and determining the ampere-hours of energy delivered by the battery while it is connected to test load; and determining when the acceleration of the monitored battery voltage changes from negative to positive, and then projecting the ampere-hours of energy that would be delivered by the battery for the remainder of the range of useful output voltages from the battery. The total present capacity of the battery is preferably determined by summing the projected ampere-hours and the ampere-hours actually delivered by the battery to the test load prior to said projection.

9 Claims, 4 Drawing Sheets

BATTERY EVALUATION TEST SYSTEM

FIELD OF THE INVENTION

The present invention relates generally to battery evaluation systems and, more particularly, to an improved system for determining the present capacity of a battery without endangering the reserve energy of the battery.

DESCRIPTION OF RELATED ART

Many prior art systems used to measure the total energy storage of a battery require the near total discharge of the battery to determine "cold cranking amps" by application of heavy loads. Other previously proposed systems measure short term droop rate which does not effectively measure ampere-hour capacity nor show useful load life. The useful load life is needed to project the operating time of the system when operating on the battery only.

Martin U.S. Pat. No. 4,583,034 describes a system which has the capability of displaying ampere-hours consumed and gives a warning of low charge. That system does not determine the actual available hours of emergency operating time based on an evaluation of the capacity of the specific battery. The charger puts in a specific amount of over-charge based upon a particular battery, but as a battery ages it has a reduced capacity, and the Martin system does change the charger performance for batteries of different capacities.

SUMMARY OF THE INVENTION

It is a primary object of the present invention to provide an improved battery evaluation system which is capable of determining the capacity of a battery (e.g., in ampere-hours) without performing a deep discharge of the battery so that the reserve energy of the battery is not endangered. In this connection, a related object of the invention is to provide such a system which reduces the test time and recharge time, maintains maximum reserve energy in the battery, and minimizes stress on the battery plates and materials.

It is another important object of this invention to provide an improved evaluation system which is capable of evaluating the remaining useful life of the battery under any given load condition, thereby enabling accurate prediction of the amount of time a specified load can be operated.

A futher object of the invention is to provide an improved battery evaluation system which is capable of evaluating lead-acid batteries without being misled by the "cue de flau" effect whereby the output voltage of such batteries drops at the onset of discharge and then rises to normal levels after a short time.

A still further object of the invention is to provide an improved battery evaluation system which automatically compensates for temperature changes caused by the application of current and the resultant heating.

Yet another object of the invention is to provide an improved battery evaluation system which can be executed automatically at selected intervals without any manual intervention.

Other objects and advantages of the invention will be apparent from the following detailed description and the accompanying drawings.

In accordance with the present invention, the foregoing objectives are realized by providing a method of evaluating the present capacity of a rechargeable battery by connecting a known test load to the battery so that the battery supplies the test load with electrical current; monitoring the battery voltage while the battery is connected to the test load; monitoring the current supplied to the test load by the battery, and determining the ampere-hours of energy delivered by the battery while it is connected to test load; and determining when the acceleration of the monitored battery voltage changes from negative to positive, and then projecting the ampere-hours of energy that would be delivered by the battery for the remainder of the range of useful output voltages from the battery. The total present capacity of the battery is preferably determined by summing the projected ampere-hours and the ampere-hours actually delivered by the battery to the test load prior to said projection.

DETAILED DESCRIPTION OF THE PREFERRED EMBODIMENT

Figure 1:
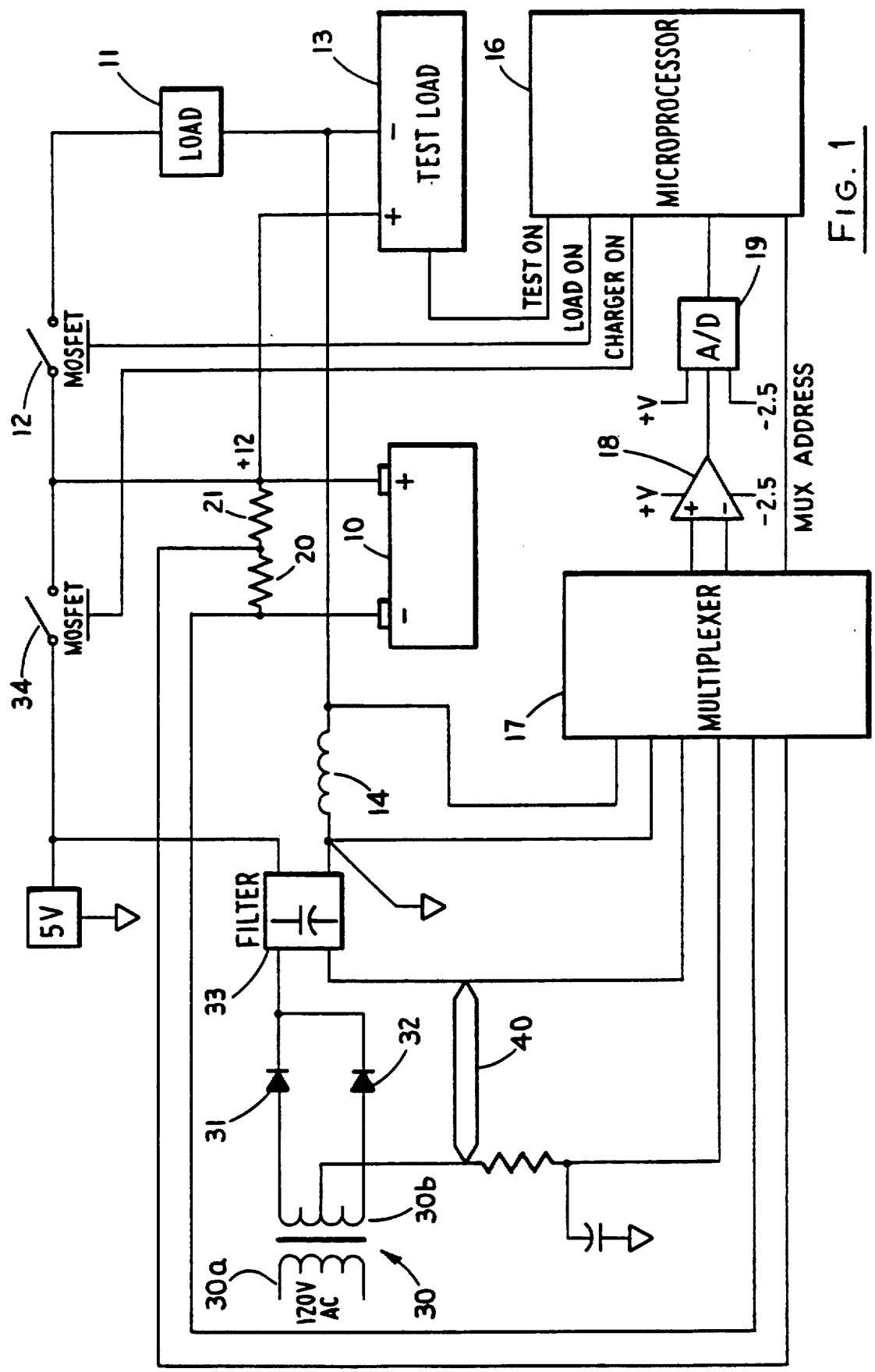
FIG. 1 is a block diagram of a battery evaluation system embodying the present invention.

While the invention is susceptible to various modifications and alternative forms, a specific embodiment thereof has been shown by way of example in the drawings and will be described in detail. It should be understood, however, that it is not intended to limit the invention to the particular form described, but, on the contrary, the intention is to cover all modifications, equivalents, and alternatives falling within the spirit and scope of the invention as defined by the appended claims.

Turning now to the drawings and referring first to FIG. 1, a battery 10, such as a 12-volt lead-acid battery, is used as a standby power source for a load 11 such as a sump pump. The load 11 is normally supplied with energy from a conventional source, and is connected to the standby battery 10 only when a controllable switch 12, such as MOSFET, is closed. The switch 12 is closed automatically in response to a failure of the conventional power source, as is well known.

To evaluate the capacity of the battery 10, and thereby determine the length of time that the battery will be capable of powering the load 11, the battery is connected to a test load 13 of known impedance. The battery voltage and current are monitored while the battery is connected to the test load 13. The battery current is monitored while the battery is connected to either the test load 13 or the actual load 11. For this purpose, a current-sensing coil 14 is connected to the ground side of both loads 11 and 13. The voltage drop across the current-sensing coil 14 is supplied to the microprocessor 16 via a multiplexer 17, a differential amplifier 18, and an analog-to-digital (A/D) converter 19. This voltage drop is proportional to the magnitude of current flow through the coil 14, and thus can be used by the microprocessor 16 to compute the ampere-hours of energy removed from the battery 10 following its connection to the test load, i.e., the "consumed capacity."

To monitor the battery voltage, a voltage divider formed by a pair of resistors 20 and 21 is connected across the battery terminals, and the voltage level between the two resistors is supplied to a microprocessor 16 via the multiplexer 17, the differential amplifier 18, and the A/D converter 19. The use of this battery-voltage value by the microprocessor 16 will be described in detail below.

Figure 2:
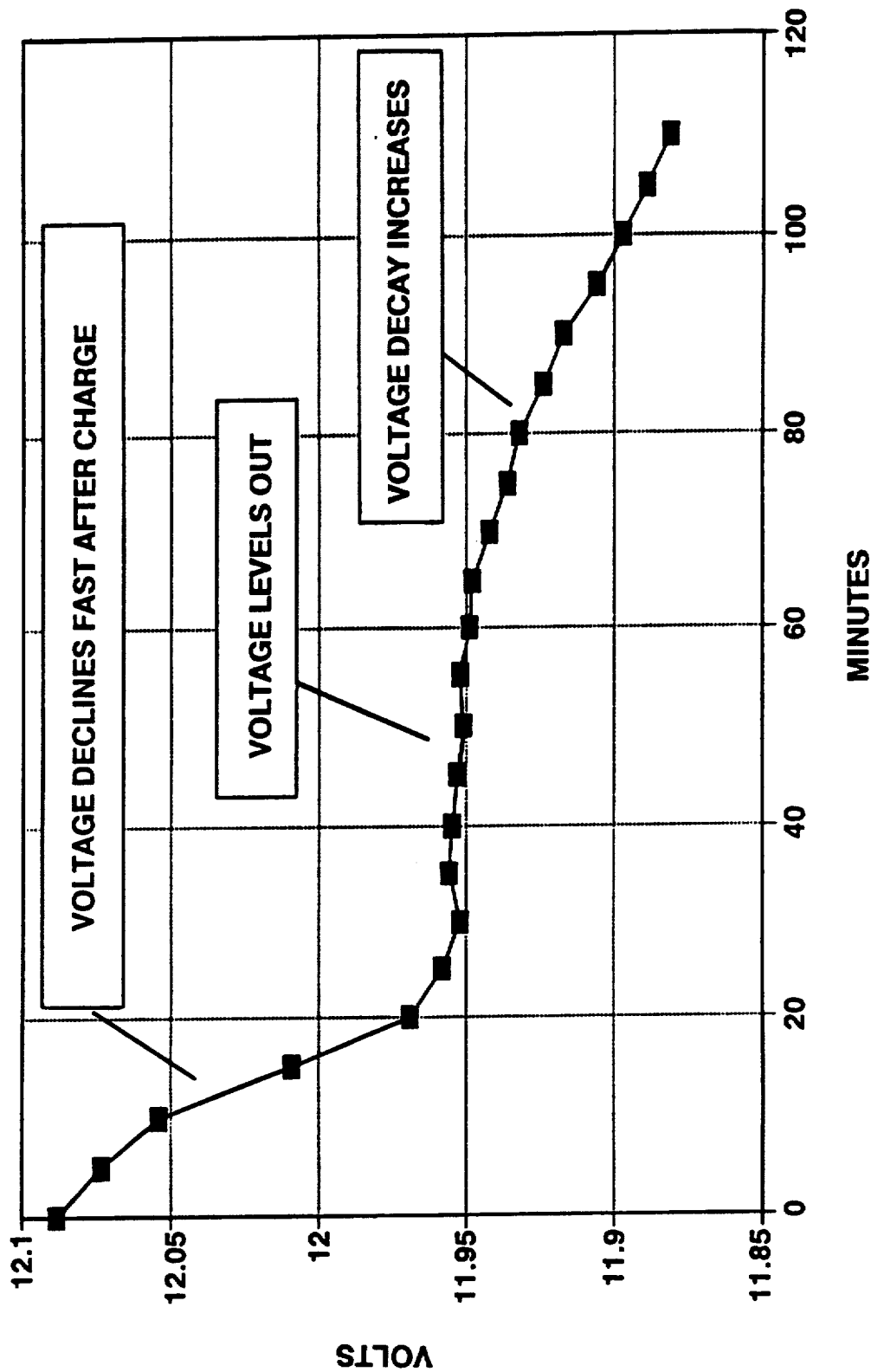
FIG. 2 is a graph of the output voltage of a battery during its evaluation by the system of FIG. 1.

The battery voltage typically follows a curve of the type illustrated in FIG. 2. It can be seen that the battery voltage declines at a rate which progressively decreases, then levels off at a substantially constant rate, and eventually increases.

Figure 3:
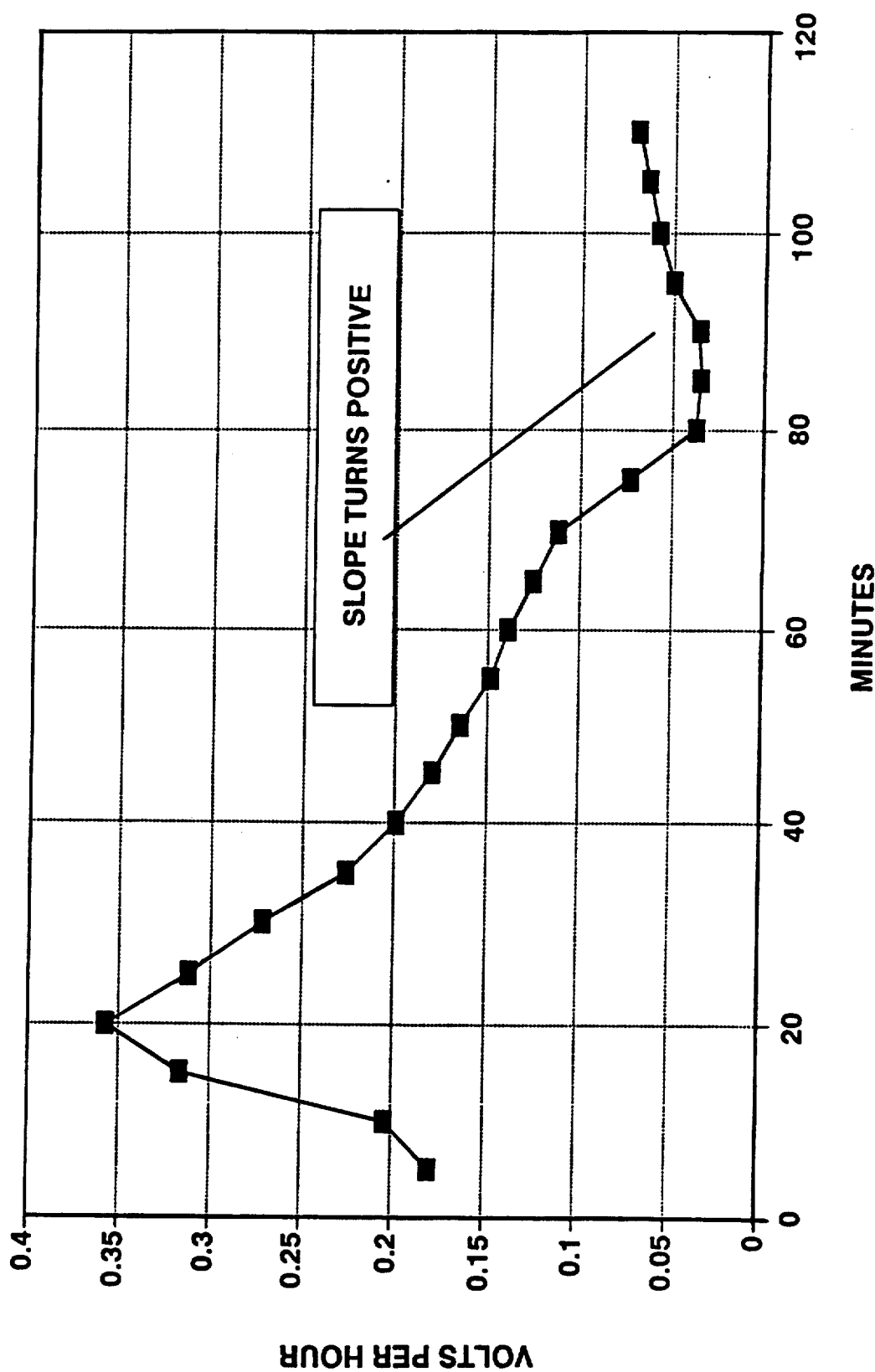
FIG. 3 is a graph of the slope of the voltage curve of FIG. 2.
Figure 4:
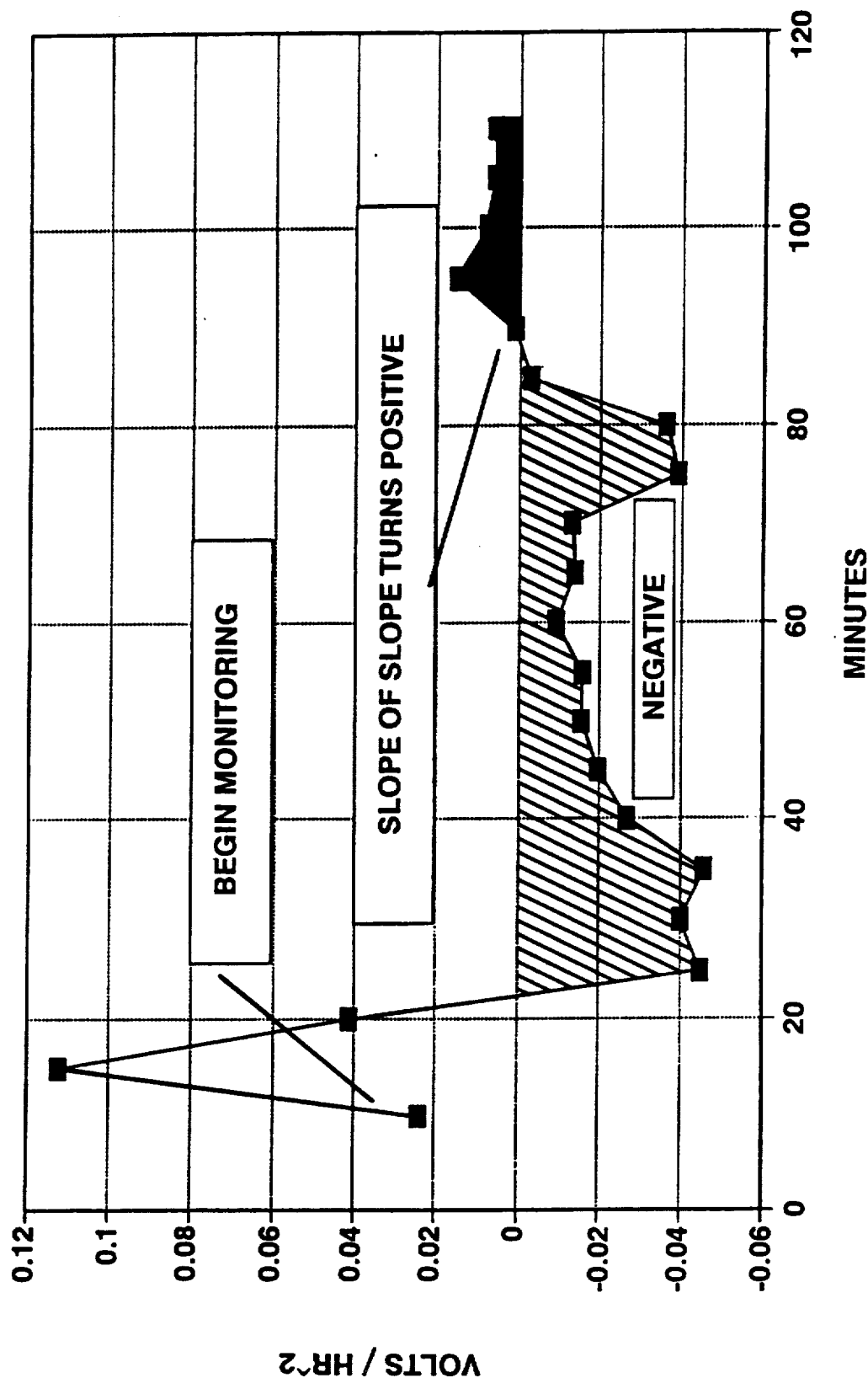
FIG. 4 is a graph showing the rate of change of the slope of the voltage curve of FIG. 2.

In order to determine the rate at which the battery voltage curve is changing, the microprocessor 16 is programmed to compute (1) the slope (in volts/hour) of the battery voltage curve at regular intervals and (2) the rate of change (in volts/hr$^2$) of that slope. For example, the computed slope values for the voltage curve of FIG. 2 are illustrated in FIG. 3, and the computed rate-of-change values for the curve of FIG. 3 are illustrated in FIG. 4. In mathematical terms, the values in FIG. 3 represent the first derivative or "speed" of the battery voltage decay, and the values in FIG. 4 represent the second derivative or "acceleration" of the battery voltage decay. The "acceleration" values will be referred to herein as "$A_{bv}$".

The first-derivative values (FIG. 3) may be computed by subtracting each sampled battery voltage value from the previously sampled value, and dividing the resulting difference by the time interval between the two samples. The second-derivative values (FIG. 4) may be computed by merely subtracting successive computed first-derivative values from each other.

As long as the battery voltage is dropping at a decreasing or constant rate, the acceleration value $A_{bv}$ computed by the microprocessor is a negative value or zero. When the rate of change of the battery voltage starts to increase, however, $A_{bv}$ becomes a positive value. At this point the battery capacity $C_r$ remaining after the rate of change of the battery voltage begins to increase, can be projected. This projected remaining capacity $C_r$ is then added to the battery capacity $C_c$ consumed after the connection of the battery to the test load, to determine the total present capacity $C_t$ of the battery. If desired, the value $A_{bv}$ may be averaged over two or three sample intervals after $A_{bv}$ first becomes positive, to smooth out small inconsistencies in measurement.

The first step in the preferred method of projecting the remaining battery capacity is to compute the apparent energy delivery rate AEDR in ampere-hours/volt by dividing the average current $I_{av}$ delivered by the battery to the test load, by the slope $S_{bv}$ of the battery voltage curve at the point where $A_{bv}$ turned positive. Thus:

$$AEDR = I_{av}/S_{bv} \text{ (ampere-hours/volt)}$$

The microprocessor 16 is programmed to determine the average current $I_{av}$ by sampling the current sensed by the coil 14 at regular intervals during the evaluation test, summing all the sampled current values, and then dividing the resulting sum by the time elapsed from the beginning of the evaluation test.

Because the usable range of a lead-acid battery is normally about two volts, the apparent energy delivery AED for a typical 12-volt lead-acid battery can be computed by multiplying AEDR by 2 volts:

$$AED = I_{av}/S_{bv} \times 2 \text{ volts} = 2I_{av}/S_{bv} \text{ (ampere-hours)}$$

This computed apparent energy delivery AED is only "apparent" because the slope of the battery voltage curve at the end of the battery's useful charge is greater than the "true slope" as computed above. Each different kind of battery has its own characteristic "slope ratio" SR, which is the ratio of the slopes of the battery voltage curve (1) at the end of the battery's useful charge and (2) when the evaluation of the battery capacity is initiate. In the case of most lead-acid batteries, for example, it has been empirically determined that the slope ratio is typically 4. Dividing the apparent energy delivery AED by this slope ratio SR yields the projected remaining battery capacity $C_r$:

$$C_r = AED/SR$$

During the initial portion of a battery evaluation, i.e., from the time the battery is connected to the test load until the rate of change of the battery voltage starts to increase, a portion $C_c$ of the battery capacity is actually consumed. This consumed capacity $C_c$ must be added to the projected remaining capacity $C_r$ to arrive at the total present battery capacity $C_t$ available to be utilized to service the actual load 11:

$$C_t = C_r + C_c$$

It is for this reason that the ampere-hours delivered by the battery are monitored and retained in the memory of the microprocessor throughout the evaluation process. The microprocessor can accomplish this function in several different ways. For example, the value of the current sensed by the coil 14 can be sampled at regular intervals, and then the average of all the sampled values can be determined at the time the total battery capacity $C_t$ is computed. Multiplying the resulting average value, in amperes, by the number of hours that the battery was in use, yields the consumed capacity $C_c$ in ampere-hours. Alternatively, each sampled current value, in amperes, can be multiplied by the sampling interval, in hours, with the product of each such multiplication being added to the cumulative sum of all previous such products.

The battery should be charged before it is subjected to the evaluation process described above. In the system of FIG. 1, charging current for the battery is supplied by a transformer 30 having a primary winding 30a connected to an a-c. supply line. The output from the secondary winding 30b of the transformer is rectified by a pair of diodes 31 and 32 and filtered by a capacitor 33. Connection of the battery 10 to the source of charging current is controlled by a controllable switch 34, such as a MOSFET, which receives its control signal from the microprocessor 16. When the switch 34 is open, the rectified voltage typically has a value of about 18 volts.

To monitor the magnitude of the charging current, a copper foil 40 is connected from a center tap on the secondary transformer winding 30b to ground. The voltage across the foil 40 is proportional to the charging current and is supplied to the microprocessor 16 via the multiplexer 17, the differential amplifier 18 and the A/D converter 19.

The microprocessor is programmed to execute an algorithm for automatically adjusting any detected value of current to compensate for heating effects. This algorithm corresponds to the following equation:

$$I = I/(CI^2 + BI + A)$$

where I is the detected value of the current, I is the correct value of the current, and the values of the coefficients A, B and C are predetermined by supplying known currents to the copper sensing element and measuring the corresponding voltages across the sensing element. The differences between the detected current values and those represented by the measured voltage levels are then computed, and linear regression is then used to obtain the values of the coefficients A, B and C needed for the above equation to restore the detected values I to the correct values I. Those values of the coefficients are then stored in the microprocessor for use in the copper correction algorithm each time the detected value of the current is sampled.

The numerical values used to plot the graph of FIGS. 2–4 are as follows:

| Minutes | Volts  | Slope v/hr | Acceleration v/hr² |
|---------|--------|------------|--------------------|
| 0       | 12.088 |            |                    |
| 5       | 12.073 | 0.180      |                    |
| 10      | 12.054 | 0.204      | 0.0240             |
| 15      | 12.009 | 0.316      | 0.1120             |
| 20      | 11.969 | 0.357      | 0.0410             |
| 25      | 11.958 | 0.312      | −0.0450            |
| 30      | 11.952 | 0.272      | −0.0400            |
| 35      | 11.956 | 0.226      | −0.0457            |
| 40      | 11.955 | 0.199      | −0.0268            |
| 45      | 11.953 | 0.180      | −0.0195            |
| 50      | 11.951 | 0.164      | −0.0156            |
| 55      | 11.952 | 0.148      | −0.0160            |
| 60      | 11.949 | 0.139      | −0.0094            |
| 65      | 11.948 | 0.125      | −0.0140            |
| 70      | 11.942 | 0.112      | −0.0130            |
| 75      | 11.936 | 0.073      | −0.0390            |
| 80      | 11.932 | 0.037      | −0.0360            |
| 85      | 11.924 | 0.034      | −0.0030            |
| 90      | 11.917 | 0.035      | 0.0010             |
| 95      | 11.906 | 0.050      | 0.0150             |
| 100     | 11.897 | 0.058      | 0.0080             |
| 105     | 11.889 | 0.064      | 0.0060             |
| 110     | 11.881 | 0.070      | 0.0060             |

The voltage values in column 2 of the above table were sampled by the microprocessor at five-minute intervals. The slope values in column 3 were computed by determining the difference between each successive pair of voltage values and dividing that difference by 0.0833 hr. (5 minutes). The "acceleration" values in column 4 are the differences between successive pairs of slope values in column 3.

The microprocessor is programmed to detect the occurrence of n consecutive positive acceleration values following a negative acceleration value (where the value of n is, for example, 5). After n consecutive positive values have been detected, the microprocessor averages the last three values to determine the value of $S_{bv}$ to be used in the battery evaluation. In the above example, five consecutive positive values occurred between 90 and 110 minutes, and the average of the last three values was 0.064 volt/hr². The values of $I_{av}$ and $C_c$ in the above example were 10.518 amp. and 19.9 amp-hrs., respectively. Thus, the battery capacity was evaluated as follows:

$$AEDR = I_{av}/S_{bv} = 10.518/0.064 = 164.344 \text{ amp.-hrs./v.}$$

$$AED = AEDR \times 2 \text{ v.} = 328.69 \text{ amp.-hrs.}$$

$$C_r = AED/SR = 328.69/4 = 82.1719 \text{ amp.-hrs.}$$

$$C_t = C_r + C_c = 82.1719 + 19.9 = 102.0719 \text{ amp.-hrs.}$$

One use of the battery-capacity value determined by the evaluation process of this invention is to ascertain the optimum "equalization" of the battery at the end of a charging operation. "Equalization" is the process of subjecting a battery to a controlled amount of overcharge with gassing to stabilize the cells, reduce electrolyte stratification and minimize sulfation. The amount of equalization is typically from 3% to 20% of battery capacity as determined by the evaluation process described above.

We claim:

1. A method of evaluating the present capacity of a rechargeable battery, said method comprising the steps of
   connecting a known test load to the battery so that the battery supplies the test load with electrical current;
   monitoring the battery voltage while the battery is connected to the test load;
   monitoring the current supplied to the test load by the battery, and determining the ampere-hours of energy delivered by the battery while it is connected to said test load; and
   determining when the acceleration of the monitored battery voltage changes from negative to positive, and then projecting the ampere-hours of energy that would be delivered by the battery for the remainder of the range of useful output voltages from the battery.

2. The method of claim 1 which includes the step of determining the total present capacity of the battery by summing said projected ampere-hours and said ampere-hours actually delivered by the battery to said test load prior to said projection.

3. The method of claim 1 wherein said projecting step determines the apparent energy delivery rate of the battery at the time the acceleration of the monitored battery voltage changes from negative to positive, and then adjusts that apparent energy delivery rate to allow for decreases in the actual energy delivery rate over said remainder of the range of useful output voltages from the battery.

4. The method of claim 1 wherein said projecting step comprises
   determining the apparent energy delivery rate of the battery by dividing (1) the average value of the current supplied to the test load from the battery by (2) the value of the rate of change of the battery voltage at about the time the acceleration of the monitored battery voltage changes from negative to positive;
   multiplying said apparent energy delivery rate by the usable range of the battery voltage; and
   dividing the resulting product by the slope ratio of the battery voltage to determine the ampere-hours of energy that would be delivered by the battery for the remainder of its range of useful output voltages.

5. The method of claim 4 wherein said slope ratio is the ratio of the rates of change of the battery voltage (1)

at the lower end of the usable range of battery voltage and (2) when the evaluation change of the battery capacity is initiated.

6. The method of claim 1 which includes the steps of monitoring the energy removed from the battery while the battery is connected to said test load to determine the battery capacity actually consummed after the connection of the battery to the test load, and adding said projected ampere-hours of energy to said consumed capacity to determine the total present capacity of the battery.

7. The method of claim 1 which includes the step of charging the battery before connecting the battery to the test load.

8. The method of claim 2 which includes the step of charging said battery to a level of overcharge which is a predetermined precentage of said total present capacity of the battery.

9. The method of claim 1 wherein said battery voltage is monitored by repeatedly sampling the battery voltage at equal time intervals, and said acceleration of the monitored battery voltage is determined by periodically computing the rate of change of the sampled battery voltage values, and periodically computing the rate of change of said rate of change.

* * * * *